Figure 1:
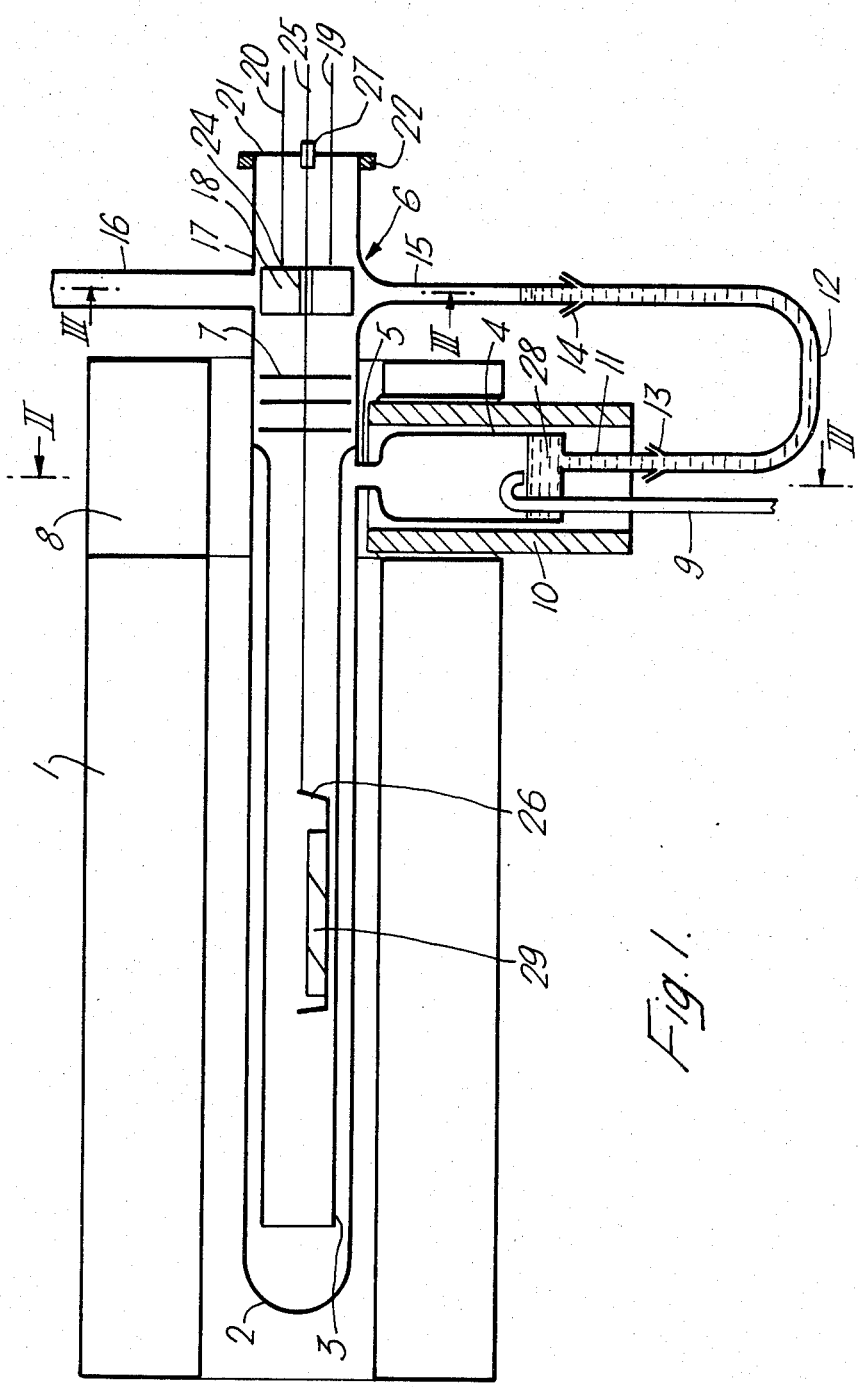

United States Patent [19]

Brice et al.

[11] Patent Number: 4,536,227
[45] Date of Patent: Aug. 20, 1985

[54] METHOD OF AND APPARATUS FOR PRODUCING A CONTROLLED UNSATURATED VAPOR PRESSURE OF A VOLATILE LIQUID IN A HEAT TREATMENT CHAMBER

[75] Inventors: John C. Brice, Copthorne Bank; Colin R. Brough, Blackburn, both of England

[73] Assignee: U.S. Philips Corporation, New York, N.Y.

[21] Appl. No.: 560,046

[22] Filed: Dec. 9, 1983

[30] Foreign Application Priority Data

Dec. 22, 1982 [GB] United Kingdom ............... 8236059

[51] Int. Cl.³ .............................................. C22F 1/02
[52] U.S. Cl. .................................. 148/13.1; 148/20.3
[58] Field of Search ...................... 148/131, 20.3, 175, 148/1.5; 420/903, 590

[56] References Cited

U.S. PATENT DOCUMENTS

| | | | |
|---|---|---|---|
| 3,836,408 | 9/1974 | Kosano | 148/175 |
| 3,979,232 | 9/1976 | Hager et al. | 148/20.3 |
| 4,374,684 | 2/1984 | Micklethwaite | 148/13.1 |

FOREIGN PATENT DOCUMENTS

0990518 4/1965 United Kingdom .

Primary Examiner—L. Dewayne Rutledge
Assistant Examiner—S. Kastler
Attorney, Agent, or Firm—Norman N. Spain

[57] ABSTRACT

It is necessary in many heat treatment processes conducted in open systems to maintain a given partial pressure of a volatile component of a material being treated, and it is desirable to conserve this volatile component, both on account of cost and in the case of components such as mercury, toxicity. A controlled unsaturated vapor pressure of a volatile liquid 28 may be produced in a tube 3 by passing a stream of a carrier gas through a vaporizer 4 containing the liquid 28 at a temperature $T_s$, passing the mixture of the carrier gas and vapor of the liquid 28 through a tube 3 containing material 29 to be treated, which material 29 is at a temperature $T_t$. The mixture of the carrier gas and vapor of the liquid 28 is then passed to a condenser 6 from which the carrier gas is vented to waste, and the vapor of the liquid 28 is condensed at a temperature $T_c$ in the condenser 6. $T_t > T_s > T_c$. The condensate passes from the condenser 6 to the vaporizer 4 through a tube 12, and the liquid 28 fills a cross-section of a length of the tube 12.

10 Claims, 4 Drawing Figures

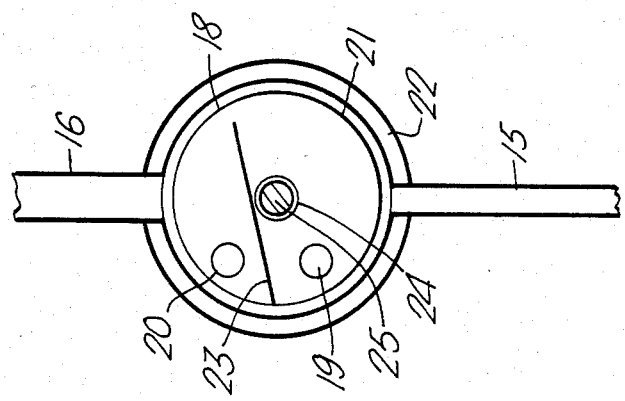
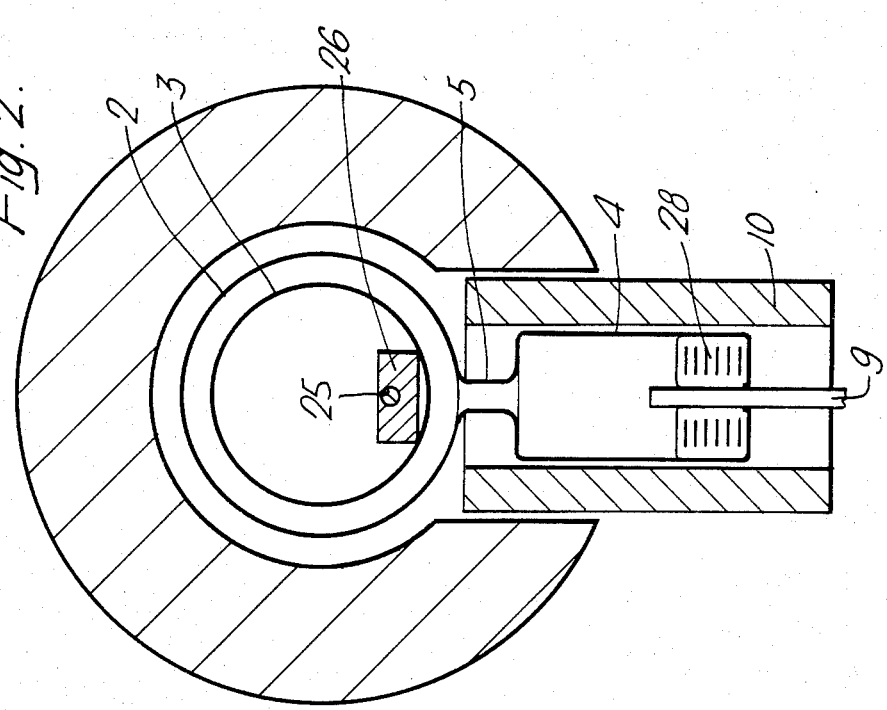

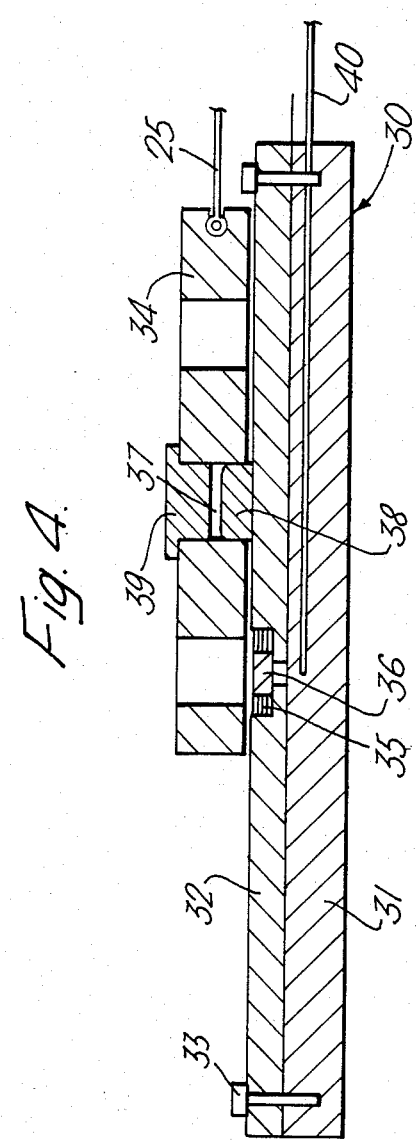

METHOD OF AND APPARATUS FOR PRODUCING A CONTROLLED UNSATURATED VAPOR PRESSURE OF A VOLATILE LIQUID IN A HEAT TREATMENT CHAMBER

The invention relates to a method of producing a controlled unsaturated vapour pressure of a volatile liquid at a temperature $T_t$ in a heat treatment chamber, to an apparatus when used to perfrom such a method, to a method of growing a layer of a substance on a substrate by a liquid phase epitaxy growth process, which substance contains a component which is a volatile liquid, and to a method of annealing a substance containing a component which is a volatile liquid.

It is necessary in many heat treatment processes to maintain a partial pressure of a volatile component in a heat treatment chamber containing a material being treated, either to compensate for loss of the volatile component from this material, or to provide a source of a substance which is to be diffused into this material. In the simplest case, the heat treatment is conducted in a sealed ampoule. Such a system suffers from several disadvantages. The total pressure and the partial pressure of the volatile component in the ampoule are both functions of the temperature of the ampoule and of the quantity of the component sealed into the ampoule. There is no possibility of removing impurities from the ampoule, for example water vapour produced during sealing of the ampoule, and/or released from the walls of the ampoule in the course of the heat treatment. It is not easy to mechanically move objects contained in the ampoule.

Thus open systems are often used for the performance of such heat treatments, in which vapour of the volatile liquid is passed over the material being treated. Disadvantages of simple open systems are that the volatile liquid is wasted, with consequent expense, and this liquid and/or its vapour has to be removed from the exhaust region of the system, and this is a particular disadvantage where the volatile liquid is toxic.

United Kingdom Patent Specification No. 990,518 describes a method of producing and maintaining a vapour of a substance at a desired temperature with a vapour pressure less than the saturated vapour pressure of the substance at the desired temperature but higher than the triple point pressure, in which a first space is heated to the desired temperature, an amount of the substance is provided in a second space, the lower end of which is in open communication with a third space containing a gas at a pressure equal to the desired unsaturated vapour pressure, heat is supplied to a lower part of the second space and heat is withdrawn from an upper part of the second space so that in the lower part the substance entirely evaporates and in the upper part vapour of the substance condenses, the condensate flowing back to the lower part, in which it evaporates again, so that the substance circulates in the second space by continuous evaporation and reflux. Such a reflux system overcomes some of the problems, for example with regard to the wastage of the volatile liquid, but does not provide for varying the total pressure in the treatment chamber.

An object of the invention is to provide a method in which a controlled unsaturated vapour pressure of a volatile liquid can be maintained in a heat treatment chamber, that the volatile liquid can be recycled. Another object of the invention is to enable the total pressure in the treatment chamber to be varied without altering the partial pressure of the vapour of the volatile liquid.

The invention is characterised in that the method comprises the steps of passing a stream of a carrier gas through a vapouriser containing the volatile liquid at a temperature $T_s$, passing the mixture of the carrier gas and vapour of the volatile liquid through the treatment chamber which is at the temperature $T_t$, leading the mixture of carrier gas and volatile liquid vapour to a condenser from which the carrier gas is vented to waste and in which condenser the volatile liquid is condensed at a temperature $T_c$ and the condensate is recycled through the vapouriser, that $T_t > T_s > T_c$, and that the volatile liquid in a tube through which the condensate passes from the condenser to the vapouriser fills the cross-section of a length of the tube.

It is described but not essential that at the gas outlet of the vapouriser the partial pressure $P_s$ of the volatile liquid should be substantially equal to the partial pressure of vapour which is in equilibrium with the liquid at the temperature $T_s$. When this condition is not met, the partial pressure $P_s$ is a function of the flow-rate of the carrier gas. It is also desirable that the pressure of the carrier gas at the gas inlet of the vapouriser should exceed $P_s$.

A method according to the invention offers a number of advantages. There are significant savings in material costs, for example in the liquid phase epitaxy growth of cadmium mercury telluride in a system using this method of providing a controlled partial pressure of mercury, there was a saving of 10 g of mercury per hour. The pressure of the carrier gas can be allowed to vary without causing the partial pressure of the volatile liquid vapour to change in the treatment chamber. The flow-rate of the carrier gas can be allowed to change by a moderate amount ($\pm 5\%$) without producing changes in the partial pressure of the volatile liquid vapour in the treatment chamber. The problems of cleaning the exhaust gases and of cleaning the system are less severe.

One disadvantage of a method according to the invention is that at any time the system may hold a larger quantity of the volatile liquid than other systems, so that the hazards of catastrophic failure of the system are increased. Another disadvantage is the possibility of recycling impurities. However, volatile impurities, that is those having appreciable vapour pressures at $T_c$ will still be exhausted with the carrier gas flow, while the volatile liquid is automatically distilled in the system. It would be possible to introduce an extra distillation stage between the condensate discharged from the condenser and the liquid inlet to the vapouriser.

A method of growing a layer of a substance by a liquid phase epitaxy growth process, which substance contains a component which is a volatile liquid and the growth process is performed in a treatment chamber in which a controlled unsaturated vapour pressure of the volatile liquid is produced, is characterised in that the controlled unsaturated pressure of the volatile liquid is produced by a method according to the invention.

In may be necessary to anneal a substance which contains a component which is a volatile liquid by heating the substance at a temperature $T_t$ in a controlled unsaturated vapour pressure of the volatile liquid, in order to adjust the electrical properties of the substance, which is, for example, cadmium mercury telluride, to desired values. The controlled unsaturated vapour pressure of the volatile liquid may be produced by a method according to the invention.

Apparatus used to perform a method according to the invention comprises a reflux condenser connected to an outlet of a heat treatment chamber, and heating means for the heat treatment chamber, is characterised in that the apparatus comprises a vapouriser provided with heating means, a gas inlet, a liquid inlet and a gas outlet, that the gas outlet of the vapouriser is connected to the heat treatment chamber and that the liquid outlet of the condenser is connected to the liquid inlet of the vapouriser. Preferably the heat treatment chamber is a substantially horizontally disposed tube connected at one end to the reflux condenser.

An embodiment of the invention will now be described with reference to the following Example and to the drawings, in which:

FIG. 1 is a diagrammatic longitudinal section of an apparatus used to perform a method according to the invention, FIG. 2 is a cross-section taken on the line II—II shown in FIG. 1, FIG. 3 is a cross-section taken on the line III—III shown in FIG. 1, and FIG. 4 is a diagrammatic longitudinal section on an enlarged scale with respect to FIG. 1 of a liquid-phase epitaxy deposition device which may be used in the apparatus shown in FIG. 1.

EXAMPLE

Referring to FIG. 1, the apparatus comprises a main furnace 1 which has a 60 mm diameter bore and is 640 mm long, and has three windings (not shown). The centre winding is about 300 mm long and is controlled by a master controller and the outer windings are controlled by slave controllers so that the outer zones of the furnace 1 are approximately 2 degrees Celsius above the temperature of the centre zone. There is a central zone about 100 mm long in which the temperature changes by less than 0.1° C. Two coaxial silica tubes 2, 3 are located within the furnace 1, having outside diameters of 51 mm and 45 mm respectively and wall thicknesses of 1.5 mm.

A vapouriser 4 which is made of silica is disposed outside and adjacent to one end of the furnace 1 and has a gas outlet 5 which communicates with the interior of the silica tube 2. The end of the tube 3 which is remote from the closed end of the tube 2 is sealed to the tube 2 in such a manner that the gas flowing into the tube 3 from the gas outlet 5 can only flow into the tube 3 through the end of the tube 3 which is adjacent to the closed end of the tube 2. The open end of the tube 2 is connected to a reflux condenser 6, and the overall length of the tube 2 is 660 mm. Three radially disposed thermal screens 7 are placed in the tube 2 between the end of the furnace 1 and the condenser 6 so as to minimise heat loss from the tube 3 to the condenser 6, the clearance between the wall of the tube 3 and the thermal screens 7 being approximately 1 mm. A low power furnace 8 (having a constant power input) partly surrounds (FIG. 2) the tube 2 in the region surrounding the thermal screens 7 so as to prevent condensation of volatile liquid on the thermal screens 7 or in the tube 3 near the gas outlet 5.

The vapouriser 4 is 70 mm high, has a diameter of 20 mm, and is provided with a gas inlet 9. The vapouriser 4 is disposed within a source furnace 10 which is 110 mm high and has an internal diameter of 30 mm. A liquid inlet 11 of the vapouriser 4 is connected by a U-tube 12 fitted with conical joints 13, 14 to a liquid outlet 15 of the condenser 6. The gas inlet 9 and the U-tube 12 have internal diameters of 3 mm. The condenser 6 has a vertically-extending gas outlet 16 which has an internal diameter of 4 mm, and a side arm 17 which extends from the opposite side of the condenser 6 to the connection to the tube 2. A condensing element 18 is situated in the condenser 6 between the side arm 17 and the tube 2, and between the liquid inlet 15 and the gas outlet 16, the clearances at the constrictions between the condensing element 18 and these surrounding members being approximately 1 mm. The condensing element 18 is supported by means of a water inlet tube 19 and a water outlet tube 20 which are secured in an end-plate 21 of the side-arm 17.

This end-plate 21 is clamped to a flange 22 at the end of the side-arm 17. FIG. 3 shows the internal construction of the condensing element 18, which is provided with a baffle plate 23 which extends the flow-path of the cooling water (which is at a temperature $T_c = 18°$ C.) from the water inlet 19 to the water outlet 20. A tube 24 which is coaxial with the tubes 2 and 3 is positioned within the condensing element 18, and a rod 25 which is used to manipulate a boat 26 present in the tube 3 passes through the tube 24 and through the thermal screens 7. The rod 25 extends out of the apparatus through a polytetrafluoroethylene seal 27 in the end-plate 21. The clearances between the rod 25 and the tube 24 and the thermal screens 7 are less than 0.1 mm. The thermal screens 7 are attached to the condensing element 18 by rods (not shown). Thus when the end-plate 21 is released from the flange 22 on the side-arm 17, it is possible to withdraw the condensing element 18, the thermal screens 7 and the boat 26 as a single assembly from the apparatus.

This apparatus may be used at pressures other than atmospheric in the range from about $2 \times 10^4$ to $3 \times 10^5$ Pa by controlling the gas flow by means of outlet and inlet valves. When using the apparatus at enhanced or reduced pressures, the conical joints 13 and 14 are replaced by compression fittings which each comprise a gasket forming a seal between a pair of opposed tubes.

When treating material containing a volatile dopant, for example, arsenic, using an enhanced pressure atmosphere reduces the rates of loss of the volatile dopant from the material by a factor which is proportional to the total pressure in the apparatus. This is useful when making or treating heavily doped material. Conversely, when uniformity of dopant is important, working at a sub-atmospheric pressure which enhances loss of a volatile dopant from a material being treated can be desirable, as is shown in another context by S. E. Bradshaw and A. J. Mlavsky, J. Electronics 2 (1956) 134.

This apparatus may be used to provide a controlled partial pressure of mercury in the tube 2. 12 g of mercury 28 was placed in the vapouriser 4. The silica boat 26 containing a charge 29 of $(Cd_zHg_{1-z})_{1-y}Te_y$ where z was 0.048 and y was 0.805, was placed in the tube 3. It was found that the temperature $T_s$ of mercury in the vapouriser 4 needed to avoid any loss or gain in weight of the charge 29 at a treatment temperature of $T_t$ was given by the relationship $T_s = (0.53T_t - 11)°$C. where $T_t > 200°$ C.

This system was used in the temperature ranges $270 > T_s > 100$ and $550 > T_t > 200$, that is for mercury partial pressures from 40 Pa to $2.1 \times 10^4$ Pa, using hydrogen as the carrier gas which was supplied to the gas inlet 9 at 200 cm$^3$/min.

The following Table gives values of different treatment temperatures $T_t$ with the corresponding values of the temperature $T_s$ of the mercury in the vapouriser 4 and of the partial pressure $P_s$ of mercury in the gas stream at the gas outlet 5 of the vapouriser 4.

TABLE

| $T_t$ (°C.) | $T_s$ (°C.) | $P_s$ (Pa) |
|---|---|---|
| 550 | 280.5 | 21,200 |
| 500 | 254.0 | 11,000 |
| 450 | 227.0 | 5,300 |
| 400 | 201.0 | 2,400 |
| 350 | 174.5 | 930 |
| 300 | 148.0 | 250 |
| 250 | 121.5 | 110 |

In all the experiments conducted in this apparatus, the difference in levels between the surfaces of the mercury in the vapouriser 4 and in the tube 15 was always less than 1 mm when using flowrates of up to 1 liter per minute of hydrogen. It appeared that there would only be an appreciable difference in levels if there were a significant impedance to flow of gas between the vapouriser 4 and the tube 3 and/or between the tube 3 and the condenser 6.

FIG. 4 shows a sliding boat device 30 which was placed in the tube 3 and was used to grow 30 $\mu$m thick layers of $Cd_xHg_{1-x}Te$ from tellurium solutions of this material on cadmium telluride substrates by a sliding boat liquid phase epitaxy method. The device 30 comprises a main support 31 on which a substrate holder 32 is located by means of headed locating pins 33 which also serve as stops limiting longitudinal movement of a slider 34. The substrate holder 32 is provided with graphite spacers 35 in a recess in which a polished CdTe substrate 36 is disposed. The boat components were all made of graphite. The slider 34 is provided with a well 37 containing 1.6 g of a growth solution 38 having a composition $(Cd_zHg_{1-z})_{1-y}Te_y$ (where $z=0.056$ and $y=0.805$). The well 37 is closed by a lid 39. The temperature of the boat assembly is measured by means of a thermocouple 40 and the slider 34 is movable by means of the rod 25 which is operated from outside the apparatus shown in FIG. 1.

The boat 26 in FIG. 1 was replaced by the sliding boat device 30, and the main zone of the furnace 1 was heated to just over 500° C., and the temperature measured by means of the thermocouple 40 was 505° C. The temperature of the vapouriser 4 was increased to 253° C., and a flow of 200 cm$^3$/minute through the tube 9 was maintained. This state was maintained for 15 minutes. The system was cooled at 1° C. per minute until the temperature measured by means of the thermocouple 40 was 500° C., and the temperature of the vapouriser 4 was reduced to 251° C. The slider 34 was then moved by means of the rod 25 so that the well 37 was located above the substrate 36. The furnace 1 was then cooled at 0.1° C./minute and the vapouriser 4 was cooled at 0.06° C./minute. Cooling was continued for 30 minutes and then the slider 34 was moved so as to move the growth solution 38 off the substrate 36. The furnaces 1, 8 and 10 were switched off, and the furnaces 1 and 8 were moved axially so as to be clear of the tube 2. When the device 30 had cooled to room temperature, the apparatus was opened, and the substrate 36 and the epitaxially grown film were removed. This film was 30 $\mu$m thick, and had a composition $Cd_{0.21}Hg_{0.79}Te$.

The apparatus described with reference to FIGS. 1, 2 and 3 may be used for providing a partial pressure of a volatile liquid other than mercury, for example, water or ethanol, provided that the partial pressure desired corresponds to the vapour pressure of the liquid at a temperature which is higher than the temperature $T_c$ of the cooling water. For water when $T_s$ has values of 46.9, 60.1, 69.1, 75.9, 81.3 or 86.0° C., $P_s$ has values of $1 \times 10^4$, $2 \times 10^4$, $3 \times 10^4$, $4 \times 10^4$, $5 \times 10^4$ or $6 \times 10^4$ Pa respectively. In order to use this apparatus to provide vapour of other elements, for example, K, Na, Sb, S or Bi, it would be necessary to heat the tubes 12 and 15 above the melting-point of the element and to use a coolant which entered the inlet tube 19 above this melting-point.

We claim:

1. A method of producing a controlled unsaturated vapour pressure of a volatile liquid at a temperature $T_t$ in a heat treatment chamber, said method comprising the steps of passing a stream of a carrier gas through a vapouriser containing the volatile liquid at a temperature $T_s$, passing the mixture of the carrier gas and the vapour of the volatile liquid through the heat treatment chamber which is at the temperature $T_t$, leading the mixture of the carrier gas and the vapour of the volatile liquid from the heat treatment chamber to a condenser from which the carrier gas is vented to waste and in which condenser the volatile liquid is condensed at a temperature $T_c$, that the condensate is recycled through the vapouriser, that $T_t > T_s > T_c$, and that the volatile liquid in a tube through which the condensate passes from the condenser to the vapouriser fills the cross-section of a length of the tube.

2. A method according to claim 1, wherein the partial pressure $P_s$ of volatile liquid in the mixture leaving the vapouriser is substantially equal to the partial pressure of vapour in equilibrium with the liquid at $T_s$.

3. A method according to claim 2, wherein the pressure of the carrier gas entering the vapouriser is greater than $P_s$.

4. A method according to claim 1, wherein the volatile liquid is mercury.

5. In the method of growing a layer of a compound, a component of which is a volatile liquid, on a substrate by a liquid phase epitaxy growth process, in which process a controlled unsaturated vapor pressure of said volatile liquid is produced in a treatment chamber containing said substrate and a liquid source of said compound positioned in said treatment chamber apart from said substrate, said liquid source is heated to a temperature sufficient to vaporize said liquid source and the resultant vapor is caused to condense on said substrate maintained at a temperature below the melting point of said compound, the improvement wherein said controlled unsaturated vapor pressure is produced by the method of claim 1.

6. In the method of annealing a compound, a component of which is a volatile liquid, by heating said compound at a temperature $T_t$ in a heat treatment chamber containing a controlled unsaturated vapor pressure of said volatile liquid at said temperature $T_t$, the improvement wherein said controlled unsaturated vapor pressure of said volatile liquid is produced in said heat treatment chamber by the method of claim 1.

7. A method according to claim 5, wherein the substance has a composition defined by the formula $Cd_xHg_{1-x}Te$, that $0.4 > x > 0.15$ and that the volatile liquid is mercury.

8. The method of claim 5 wherein the volatile liquid is mercury.

9. The method of claim 6 wherein the volatile liquid is mercury.

10. A method according to claim 5, characterized in that the compound has a composition defined by the formula $Cd_xHg_{1-x}Te$, that $0.4 > x > 0.15$ and that the volatile liquid is mercury.

* * * * *